United States Patent
Mayer et al.

(10) Patent No.: US 8,518,720 B2
(45) Date of Patent: Aug. 27, 2013

(54) UV IRRADIANCE MONITORING IN SEMICONDUCTOR PROCESSING USING A TEMPERATURE DEPENDENT SIGNAL

(75) Inventors: Ulrich Mayer, Dresden (DE); Thorsten Schepers, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 12/854,995

(22) Filed: Aug. 12, 2010

(65) Prior Publication Data

US 2011/0053294 A1 Mar. 3, 2011

(30) Foreign Application Priority Data

Aug. 31, 2009 (DE) .......................... 10 2009 039 417

(51) Int. Cl.
*H01L 21/66* (2006.01)
(52) U.S. Cl.
USPC ............ 438/5; 257/E21.529; 250/492.2
(58) Field of Classification Search
USPC ................. 438/5, 7, 10, 14; 257/E21.529
See application file for complete search history.

(56) References Cited

U.S. PATENT DOCUMENTS

| | | | |
|---|---|---|---|
| 5,705,788 A * | 1/1998 | Beyer et al. | 219/121.62 |
| 6,238,937 B1 | 5/2001 | Toprac et al. | 438/9 |
| 6,455,437 B1 | 9/2002 | Davidow et al. | 438/710 |
| 7,469,831 B2 * | 12/2008 | Gu et al. | 235/454 |
| 7,605,342 B2 * | 10/2009 | Lambert et al. | 219/121.67 |
| 7,760,341 B2 * | 7/2010 | Bakshi et al. | 356/51 |
| 7,833,348 B2 * | 11/2010 | Wada et al. | 117/89 |
| 2006/0102599 A1 * | 5/2006 | Adams et al. | 219/121.62 |
| 2007/0108389 A1 * | 5/2007 | Makela et al. | 250/372 |
| 2008/0220590 A1 * | 9/2008 | Miller et al. | 438/463 |
| 2009/0107963 A1 * | 4/2009 | Lambert | 219/121.67 |

FOREIGN PATENT DOCUMENTS

DE 199 33 213 A1 7/1999

OTHER PUBLICATIONS

Translation of Official Communication from German Patent Office for German Patent Application No. 10 2009 039 417.6-33 dated Oct. 29, 2010.

* cited by examiner

*Primary Examiner* — Savitr Mulpuri
(74) *Attorney, Agent, or Firm* — Williams, Morgan & Amerson, P.C.

(57) ABSTRACT

In a UV process tool for semiconductor processing, a temperature-dependent signal may be used as a monitor signal for determining the momentary irradiance of the UV radiation source. Consequently, a fast and reliable monitoring and/or controlling of the irradiance of UV process tools may be accomplished.

10 Claims, 6 Drawing Sheets

UV IRRADIANCE MONITORING IN SEMICONDUCTOR PROCESSING USING A TEMPERATURE DEPENDENT SIGNAL

BACKGROUND OF THE INVENTION

1. Field of the Invention

Generally, the present disclosure relates to the fabrication of integrated circuits, and, more particularly, to techniques and systems for performing a UV (ultraviolet) treatment.

2. Description of the Related Art

Semiconductor devices and generally any type of microstructure devices are typically formed on specific substrates made of any appropriate material. During the very complex manufacturing sequence, a plurality of material layers are typically formed on the substrate and are subsequently treated, for instance, by etching one or more materials, implanting specific impurities, such as dopant species and the like, in order to obtain individual components having the desired characteristics. For example, semiconductive materials, insulating materials, highly conductive materials, such as metals and the like, are formed and may be patterned, for instance on the basis of sophisticated lithography techniques, in order to transfer a desired device layout from one or more lithography masks into the various material layers. Due to a continuous advance in many of the involved fabrication techniques, such as lithography, ion implantation, etching, planarizing, deposition of various material compositions and the like, the features sizes of the individual components have been reduced in order to enhance performance of these components and also to obtain an increased packing density so that more and more functions may be implemented into a single microstructure device. For example, in complex semiconductor devices, such as microprocessors of sophisticated configuration, several hundred millions of individual transistor elements may be provided in combination with the corresponding wiring network in order to provide the electrical connections between the individual circuit elements. To this end, several hundred individual process steps may typically be required to form a plurality of individual semiconductor chips on a single substrate, wherein each of these process steps has to be performed within specifically set process tolerances in order to obtain the final device characteristics. Consequently, in complex semiconductor devices or any other microstructure devices, critical dimensions of individual elements, such as field effect transistors, have reached the deep micron range wherein, currently, critical dimensions of 40 nm and less may be implemented in volume production techniques. In addition to reducing the critical dimensions of the individual semiconductor elements, also appropriate material systems may have to be used, for instance in the form of dielectric materials, conductive materials and the like. Moreover, the characteristics of these base materials may typically be adjusted on the basis of additional treatments in an attempt to enhance overall performance and reliability of complex semiconductor devices without unduly adding to the overall complexity of the manufacturing process.

For example, upon reducing the dimensions of transistor elements, thereby improving switching speed and drive current capability, the signal propagation delay may no longer be limited by the circuit elements in the transistor level but may also be strongly affected by the performance of a metallization system, which may typically be provided in the form of a plurality of stacked metallization layers, in which a network of highly conductive metal lines and vias may establish the required electrical connections. Well-established metallization systems are based on aluminum and silicon dioxide as conductive materials and interlayer dielectric materials, which, however, may no longer be appropriate for meeting the requirements of sophisticated integrated circuits. For this reason, aluminum is increasingly replaced by copper or copper alloys or other metals of superior conductivity, while at the same time the parasitic capacitance of the various metallization levels is reduced by steadily reducing the dielectric constant of the dielectric material that may electrically insulate the various conductive regions and which may provide a chemical and mechanical stability of the metallization system. Since well-approved dielectric materials, such as silicon dioxide, silicon nitride and the like, are considered inappropriate, a plurality of alternative materials have been developed in combination with associated deposition techniques in order to obtain an effective dielectric constant of approximately 3.0 and less, in which case these dielectric materials may be referred to as low-k dielectric materials. One important mechanism for reducing the dielectric constant of specific dielectric materials is the generation of a porous structure, which may be accomplished by incorporating specific components into the dielectric base material, which may subsequently be removed by treating the dielectric material. In this respect, a treatment on the basis of ultraviolet (UV) radiation has proven to be a very efficient mechanism in order to modify the characteristics of a dielectric material in view of reducing the dielectric constant.

A further example of efficiently modifying the characteristics of a dielectric base material by using UV radiation is the generation or adjustment of an internal stress level of specific dielectric materials, such as silicon nitride and the like, in order to appropriately adjust the characteristics of a circuit element, such as a transistor. For instance, it is well known that a certain type of strain in the channel region of a field effect transistor may efficiently modify the charge carrier mobility, which in turn directly translates into a modification of the drive current of the transistor. One efficient mechanism for inducing a strain component in the channel region of a field effect transistor is the provision of a dielectric material close to the transistor and the adjustment of the internal stress level of the material in accordance with device requirements. For instance, it has been recognized that the molecular structure of a silicon nitride material may be changed upon exposure to UV radiation, which may result in a removal of hydrogen, which in turn may result in a shift of an internal stress level towards a tensile stress. Upon depositing a tensile dielectric material, the internal stress level thereof may further be increased upon exposure to UV radiation.

Although the treatment on the basis of UV radiation represents a very efficient mechanism for appropriately adapting the characteristics of dielectric materials during the fabrication of complex semiconductor devices, it turns out that the final result of the UV treatment strongly depends on the process parameters, such as the irradiance of the radiation, that is, the radiative flux per unit area, the process temperature and the like. However, these process parameters may be difficult to control, as will be explained with reference to FIGS. 1$a$ and 1$b$.

FIG. 1$a$ schematically illustrates a UV process tool 100, which is to be understood as a process tool in which one or more substrates may be exposed to UV radiation, which may typically be provided with a wavelength range of approximately 200-400 nm, depending on the specific application. The tool 100 typically comprises a process chamber 101, which represents any appropriate hardware component in order to receive a substrate 110 and to establish a desired process ambient, for instance on the basis of any appropriate gases, such as inert gases, reactive gases and the like. For this purpose, typically, well-known hardware resources, such as supply lines and exhaust lines (not shown), are provided in combination with gas flow rate controllers, gas resources and the like. Furthermore, the process tool 100 comprises a radiation source 103, which may typically emit one or more UV lengths, such as mercury vapor lamps and the like, which may be appropriately arranged so as to provide UV radiation 103A to the substrate 110. For example, the radiation source 103 may comprise any appropriate compartment or housing to establish the appropriate environmental conditions for the corresponding actual UV lamps, for instance by providing an appropriate cooling system and the like. Furthermore, any optical components, such as a silica cover and the like, may be provided in the radiation source 103 as required for appropriately positioning the source 103 and directing the radiation 103A to the substrate 110. For convenience, any such components are not shown, but these components are well known in the art. Moreover, the tool 100 may comprise a heater unit 102, which may also act as a substrate holder, depending on the configuration of the tool 100.

Upon operating the UV process tool 100, the substrate 110 is positioned within the process chamber 101, for instance on the heater unit 102, which in turn may be supplied with an appropriate input power 102A in order to establish a desired process temperature within the process chamber 101. Furthermore, the radiation source 103 may be operated by supplying power to the corresponding lamps or other radiation sources in accordance with a predefined parameter setting to obtain the radiation 103A having a specific wavelength composition and also a spatially predefined shape. For example, the radiation 103A may irradiate a specified surface area on the substrate 110, which may require a repositioning of the radiation 103A relative to the substrate 110 in order to completely treat the surface of the substrate 110. In other cases, the radiation source 103 is configured such that the substrate 110 as a whole may be irradiated, wherein the results of the treatment in the tool 100 may strongly depend on the exposure dose, the wavelength range used, the process temperature, the gaseous ambient in the chamber 101 and the like. For example, the substrate 110 may have formed thereon a dielectric material, such as a low-k dielectric material, wherein chemical bonds may be reconfigured upon being exposed to the radiation 103A so that a removal of certain species may be accomplished, which may finally result in a reduced dielectric constant. Thus, the dielectric constant of the resulting dielectric material may strongly depend on the overall process parameters, which in turn may significantly affect the electrical performance of the metallization systems and thus of the semiconductor devices. Since the process parameters, such as the process temperature, the gas flow rates and the like, may be controlled with a high degree of precision, a very important parameter represents the irradiance of the radiation 103A, since this value represents the energy deposition per unit area on the surface of the substrate 110 for a given distribution of the wavelength range emitted by the radiation source 103. Thus, the irradiance in combination with the exposure time and the effective wavelength range incident on the substrate 110 may strongly affect the result of the treatment in the process tool 100. For this reason, in many conventional UV process tools, a sensor element 104 is provided at an appropriate location within the process chamber 101 in order to obtain a monitor signal 104A that is indicative of the irradiance of the radiation source 103. It is well known that the irradiance may significantly vary over lifetime of UV radiation sources, for instance due to aging, failures in one or more of the hardware components of the radiation source 103, such as contamination of optical components and the like, so that the monitor signals 104A are obtained on a regular basis. It turns out, however, that the sensor elements 104 cover only a small area within the chamber 101 so that the signal 104A may not efficiently represent the integrated irradiance of the source 103. Moreover, currently available UV sensors may also suffer from a pronounced variability so that the long term stability of the UV measurement system itself may not be guaranteed, thereby making the currently available monitor systems for UV radiation tools based on the sensor 104 less than desirable, in particular for sophisticated manufacturing techniques requiring a high uniformity of the involved processes.

FIG. 1b schematically illustrates the substrate 110 according to other conventional strategies in determining the irradiance of the radiation source. In this case, a specific material layer 111 may be provided at least locally on the substrate 110 in order to detect the effect of the radiation 103A. For this purpose, dedicated test substrates or at least dedicated test sites on a substrate have to be provided and have to be examined in order to obtain a quantitative result with respect to a certain material characteristic caused by the momentary irradiance of the radiation 103A. For instance, the dielectric constant, mechanical stress, index of refraction, the density of the material or other mechanical parameters, the shrinkage of the material and the like may be determined on the basis of a corresponding metrology process and may then be used for assessing the status of the radiation 103A. In this case, however, in addition to processing the substrate 110, a further metrology process has to be performed, which may thus not allow a fast response to the tool 100 since, typically, at least a time interval of one hour or more may be required until the measurement result is obtained. In this time interval, the tool 100 may not be available or may be operated with a high risk of producing non-acceptable process results.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure provides UV treatment tools and methods in which materials during the semiconductor processing may be efficiently processed on the basis of UV radiation, while additionally providing superior monitoring capabilities for assessing the momentary irradiance of a radiation source used during the UV treatment. To this end, an appropriate monitor signal may be obtained, which may be correlated to the temperature of one or more hardware components within the process chamber which are affected by the UV radiation emitted by the radiation source. It has been recognized that the thermal conditions within the process chamber may be strongly related to the momentary irradiance of the radiation source so that a monitor signal may be obtained that is correlated to the process temperature or a temperature of a hardware component in the process chamber. Consequently, the temperature under consideration and thus the signal indicative of this temperature may represent an average of the irradiance effects of the entire wavelength range of the radiation source so that the monitor signal may be sensitive to a variation of irradiance of the whole wavelength range, or a portion thereof, wherein, at the same time, a spatial average may also be obtained, thereby avoiding the assessment of the momentary irradiance on the basis of a very restricted scan area, as may typically be the case in conventional UV process tools including a specific UV sensor. Thus, in some illustrative embodiments disclosed herein, the monitor signal may represent a temperature signal of any appropriate hardware component, such as a chamber wall, a heater unit, a substrate, if present in the process chamber, and the like, so that a high degree of flexibility is provided in order to assess the irradiance at any desired point in time. For example, the monitoring may be performed without a substrate or may be performed during the processing of a substrate, thereby also providing the possibility of monitoring the irradiance on the basis of individual process runs, which may thus provide a high degree of process uniformity. In other illustrative embodiments disclosed herein, the monitor signal may be obtained on the basis of hardware components, such as a control unit configured to operate a heater unit, which may thus provide information on the thermal effect of the radiation to be monitored for a constant temperature process scenario. In other illustrative aspects disclosed herein, the monitor signal may be efficiently used to control the radiation source during the UV treatment in order to maintain the momentary irradiance within predefined limits, which may even enable a run-to-run process control due to the fast response to a change of the thermal conditions and thus the effective irradiance.

One illustrative method disclosed herein relates to the monitoring of UV irradiance during the semiconductor processing in a UV process tool. The method comprises operating a UV radiation source of the UV process tool with a predefined parameter setting. The method additionally comprises obtaining a monitor signal from a hardware component of the UV process tool, wherein the monitor signal indicates a process temperature in a process chamber of the UV process tool. Additionally, the method comprises determining a UV irradiance status of the radiation source by using the predefined parameter setting and the monitor signal.

A further illustrative method disclosed herein comprises determining a process temperature in a process chamber of a UV process tool. The method further comprises exposing a dielectric material formed above a substrate of a microstructure device to UV radiation of a radiation source of the UV process tool. Additionally, the method comprises determining an effective irradiance of the radiation source by using the process temperature.

One illustrative UV process tool disclosed herein comprises a process chamber configured to receive a substrate to be exposed to UV radiation. The process tool further comprises a radiation source positioned to provide the UV radiation to the substrate. Moreover, a hardware component is provided and is operatively connected to the process chamber and is configured to provide a monitor signal that is indicative of a process temperature in the process chamber. Moreover, the process tool comprises a control unit configured to receive the monitor signal and to provide a status signal indicating an irradiance of the radiation source on the basis of the monitor signal.

BRIEF DESCRIPTION OF THE DRAWINGS

The disclosure may be understood by reference to the following description taken in conjunction with the accompanying drawings, in which like reference numerals identify like elements, and in which.

Figure 1A:
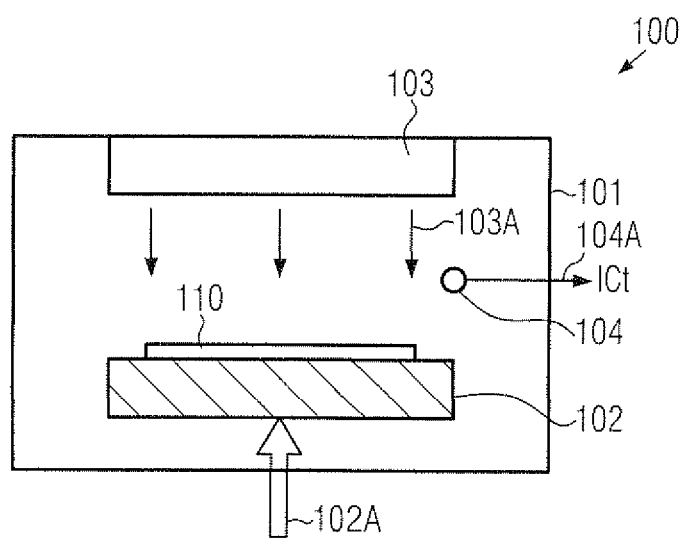
FIG. 1a schematically illustrates a UV process tool comprising a conventional UV sensor for monitoring irradiance of the process tool according to conventional strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure contemplates the monitoring and, in some illustrative embodiments, the controlling of the irradiance of a UV radiation source in a UV process tool. To this end, thermal conditions in the process chamber may be used as a "sensor" for the momentary irradiance supplied by the radiation source, since, in total, the radiation may significantly contribute to the global temperature in the process chamber. Since the remaining process parameters, such as gas flow rates, input power to heater units and the like, may be controlled with a high degree of long-term stability, a corresponding variability in the thermal conditions may be efficiently correlated to a variability of the irradiance of the radiation source under consideration. Consequently, by determining a monitor signal that is sensitive to the thermal conditions, and thus to the temperature of any appropriate component of the process chamber, any fluctuations in the irradiance, for instance across a significant portion of the wavelength range or within a restricted wavelength range, may be efficiently detected. Consequently, based on a monitor signal representing the thermal conditions, the irradiance may be monitored with any desired temporal resolution, however, within the time constant for temperature changes of a corresponding hardware component, without requiring specific metrology techniques and dedicated substrates or substrate sites, as may frequently be the case in conventional strategies, as described above. In some illustrative embodiments, a heater unit may be provided in the process chamber and may thus be used as an efficient "sensor," since the temperature thereof may depend, for a given parameter setting of the heater unit itself, from the irradiance of the radiation source. The temperature of the heater unit, which may be indicative of an "average" of the wavelength range and the spatial characteristics of the radiation under consideration, may be efficiently determined, for instance, by internal temperature sensors, thermocouples and the like. In other illustrative embodiments, a tool internal control system may be used as a sensor, which may operate the heater unit so as to maintain a substantially constant temperature, thereby requiring a varying input power depending on the varying thermal influence of the radiation to be monitored. Consequently, the magnitude of the input power supplied to the heater unit may be used as an efficient monitor signal in order to indicate the momentary irradiance of the UV radiation.

In still other illustrative embodiments, the monitor signal may additionally be used for controlling the radiation source in order to provide superior stability of the UV treatment.

Figure 1B:
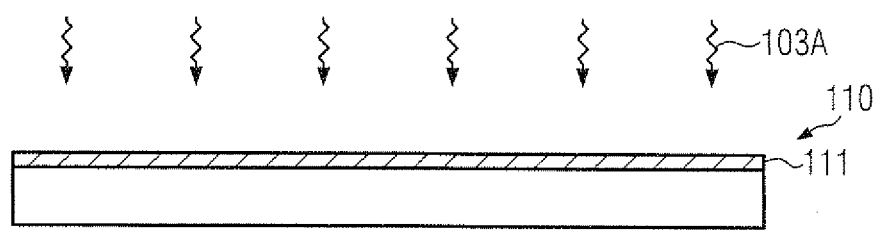
FIG. 1b schematically illustrates a cross-sectional view of a substrate when exposed to UV radiation, wherein the irradiance may be observed by measuring one or more material characteristics on the basis of dedicated metrology processes, according to further conventional techniques.

With reference to FIGS. 2, 3*a*-3*d* and 4*a*-4*d*, further illustrative embodiments will now be described in more detail, wherein reference may also be made to FIGS. 1*a*-1*b*, if appropriate.

Figure 2:
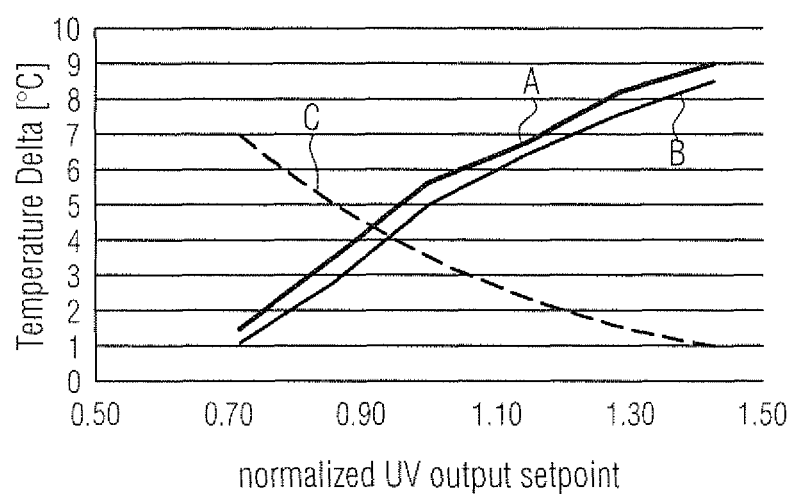
FIG. 2 schematically illustrates a correlation between the thermal conditions in a process chamber and the irradiance of a radiation source as may be used for monitoring the momentary irradiance, according to illustrative embodiments.

FIG. 2 schematically illustrates a correlation between the thermal conditions in a process chamber of a UV tool and the momentary irradiance of a radiation source of the UV process tool. For example, the thermal conditions may be depicted along the vertical axis, for instance in the form of the temperature difference of the momentary temperature of a heater unit for a given parameter setting of the heater unit. The horizontal axis represents the momentary irradiance, for instance in the form of a normalized output set point. That is, for a given heater unit setting and for a given set point of a UV radiation source, the irradiance may be selected as 1.0 and, for constant parameter settings of the heater unit, a corresponding change in temperature with respect to initial temperature may be determined. For example, curves A and B may represent the correlation for different process chambers, which may have any appropriate configuration, as is, for instance, previously explained with reference to the tool 100 or as will be explained later on in more detail. Thus, a pronounced temperature variation may be observed depending on a variation of the irradiance in the different process chambers, which may enable an efficient monitoring of the irradiance based on a signal that is indicative of the thermal conditions, such as the temperature difference as shown in FIG. 2. For example, the radiation may be generated on the basis of a broadband UV lamp that emits a wavelength range of approximately 180 nm to approximately 450 nm, wherein the spectra distribution as well as the integral of the emitted spectrum may vary along the lifetime of the UV lamp. It should be appreciated, however, that a corresponding correlation may be obtained for any appropriate UV irradiation source in order to efficiently monitor the effective irradiance.

In other cases, any other appropriate monitor signal for representing the thermal conditions within the process chamber may be used, such as a signal indicative of an input power to a heater unit, as indicated by curve C, when a constant temperature operating mode may be available in the process tool. That is, if a tool internal control system may be available which may control the temperature of a heater unit so as to be substantially constant during the processing of the tool, the required input power may also reflect the thermal contribution provided by the UV radiation source and, hence, the corresponding signal may be representative for the momentary irradiance. For example, when a moderately low irradiance is applied by the irradiation source, an increased input power has to be supplied to a heater unit in order to obtain a desired constant temperature. Similarly, upon increasing the irradiance, the input power required for obtaining the constant temperature has to be reduced, as is, for instance, qualitatively illustrated by curve C.

It should be appreciated that, in principle, any component within a process chamber may be used for determining the thermal condition, as long as a corresponding hardware component may be sufficiently "coupled" to the radiation and to the substrate in order to appropriately reflect the condition at the substrate. Since a heater unit may typically be in contact with the substrate, which in turn may be exposed to the radiation, thereby receiving a pronounced fraction of the total radiation emitted by the radiation source, a very representative signal may be obtained by determining the temperature of the heater unit or any other characteristics that may be correlated with its temperature.

Figure 3A:
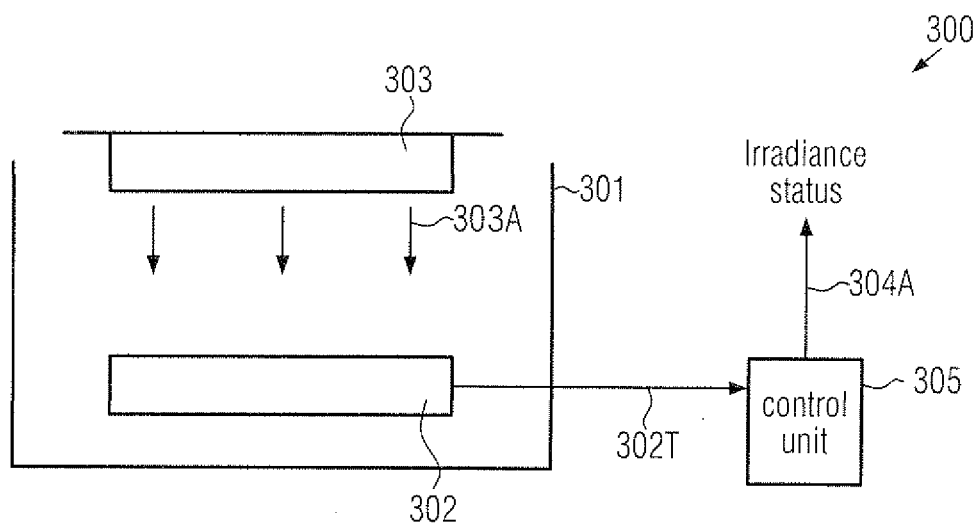
FIGS. 3a-3b schematically illustrate UV process tools in order to monitor an irradiance status, according to illustrative embodiments.

FIG. 3*a* schematically illustrates a UV process tool 300, which may have basically the same configuration as the tool 100 as previously described and may thus comprise a process chamber 301 configured to receive one or more substrates to be processed by the tool 300. Furthermore, a radiation source 303 of any appropriate configuration, as, for instance, explained before with reference to the tool 100, may be provided to provide UV radiation 303A within the chamber 301. Furthermore, a hardware component 302, such as a substrate holder and the like, may be provided to thermally communicate with the radiation 303A, for instance, via a substrate or by being directly exposed to the radiation 303A if a substrate is not provided in the chamber 301. In some illustrative embodiments, the hardware component 302 may comprise a heater unit which may be configured to establish a desired temperature, for instance on the basis of electric energy, fluids and the like. In this case, the temperature of the heater unit 302 may also be referred to as a process temperature, since this temperature may be selected on the basis of a desired target value in accordance with a corresponding process recipe to be performed in the tool 300, wherein, however, the temperature of the heater unit 302 may not necessarily be the same as the temperature of other hardware components in the process chamber 301 if the thermal response time of the chamber 301 may be significantly greater compared to the unit 302. Typically, at least a substrate to be brought into contact with the unit 302 may have substantially the same temperature as the heater unit 302. In the embodiment shown, the component 302 in the form of a heater unit may be configured to provide a temperature indicating signal 302T, which may also be referred to as a monitor signal, which may thus represent the temperature of the unit 302 that is influenced by the radiation 303A, as is previously explained with reference to FIG. 2. It should be appreciated that a temperature signal may be readily obtained on the basis of any temperature sensor, such as thermocouples, platinum resistors and the like, which provide sufficient accuracy in order to appropriately resolve a variation in temperature within approximately 0.1° C. and even less. The tool 300 may further comprise a control unit 305 that is operatively connected to the process chamber 301 so as to receive the monitor signal 302T. Moreover, the control unit 305 may be further configured to provide a status signal 304A, which may represent the irradiance status of the radiation 303A. For example, the control unit 305 may provide the monitor signal 302T itself or any processed version thereof as the status signal 304A, thereby allowing a substantially continuous monitoring of the irradiance in the process chamber 301. In other cases, the control unit 305 may have implemented therein a correlation, for instance as shown in FIG. 2, so that an invalid status may be indicated when the monitor signal 302T may be outside of a predefined value range compared to appropriate reference data, such as the correlation shown in FIG. 2. For example, appropriate threshold value may be established for the monitor signal 302T on the basis of previously obtained measurement data or on the basis of the monitor signal 302T obtained during the past. For this case, a specific value of the monitor signal 302T may be used as a desired value and a deviation therefrom, for instance deviation of ± a certain predefined percentage, may be considered as not acceptable and may result in an invalid irradiance status.

Figure 3B:
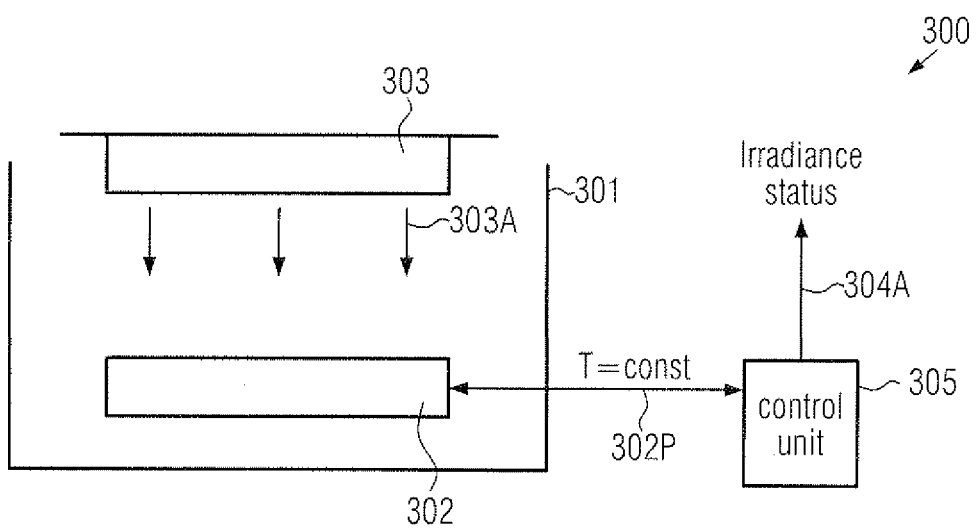

FIG. 3b schematically illustrates the tool 300 according to further illustrative embodiments in which the hardware component 302 may represent a heater unit, as explained above, which may be operated on a constant temperature mode by the control unit 305. Consequently, input power, for instance in the form of electric energy, the flow rate of a coolant and the like, has to be provided to the unit 302, which may vary depending on the energy deposition generated by the radiation 303A depending on the momentary irradiance. Consequently, a measure or signal indicative of the input power supplied to the unit 302, as indicated by 302P, may be used as an efficient monitor signal in order to obtain the status signal 304A. It should be appreciated that efficient control mechanisms for maintaining a substantially constant temperature of a heater unit are well established in the art and may be used in the control unit 305 in order to obtain the monitor signal 302P.

Figure 3C:
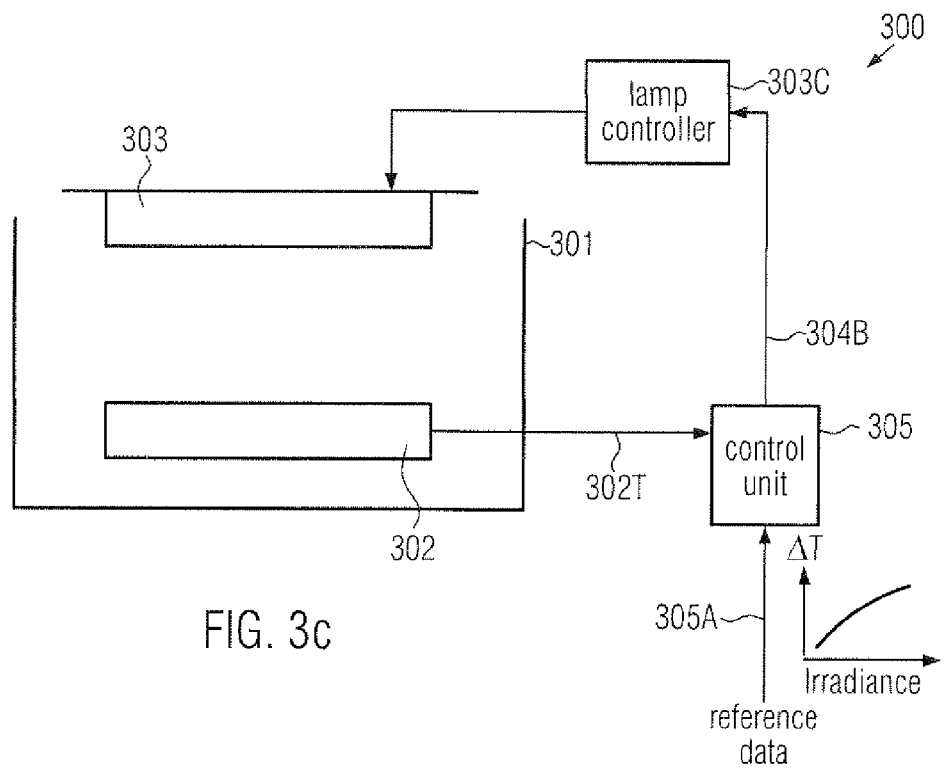
FIGS. 3c-3d schematically illustrate UV process tools in which irradiance control may be accomplished on the basis of a temperature indicative monitor signal, according to further illustrative embodiments.

FIG. 3c schematically illustrates the process tool 300 according to further illustrative embodiments in which superior uniformity of the irradiance may be accomplished by implementing a control mechanism. As illustrated, the tool 300 may comprise the control unit 305 that may be operatively connected to a lamp controller 303C, which may supply power to the radiation source 303. Furthermore, the control unit 305 may receive the monitor signal 302T and may receive or may have implemented therein appropriate data or algorithms in order to provide a control signal 304B to the lamp controller 303C in order to re-adjust a target parameter setting of the radiation source 303. For example, appropriate reference data, as indicated by 305A, may be implemented or provided to the unit 305 and may be processed therein on the basis of the monitor signal 302T in order to determine a new parameter setting for the lamp controller 303C, which in turn may adjust the energy supplied to the radiation source 303 so as to obtain an irradiance within a desired range.

Figure 3D:
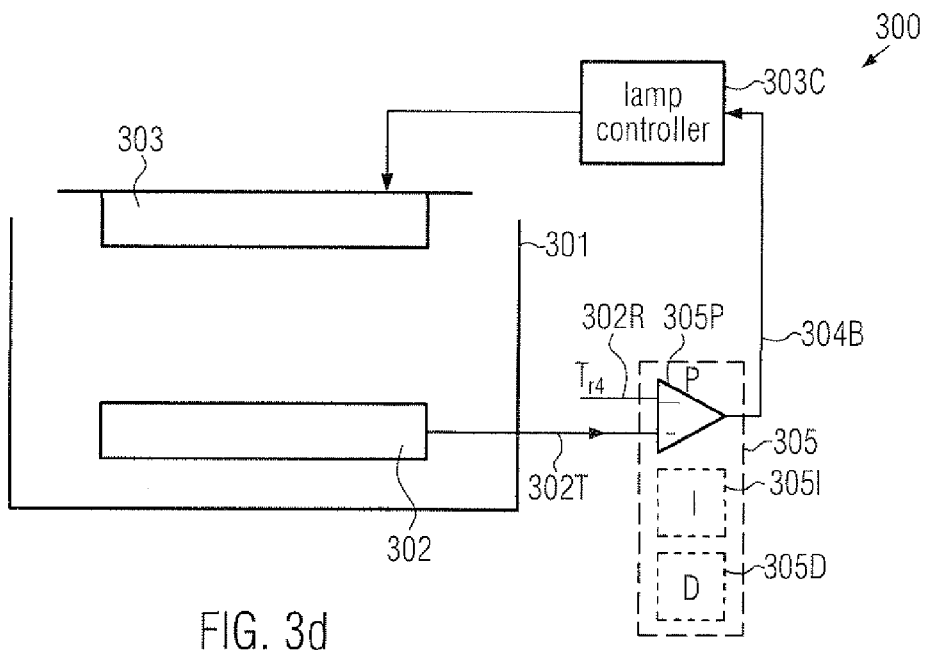

FIG. 3d schematically illustrates the tool 300 according to one illustrative embodiment in which the control of the lamp controller 303C may be based on a mechanism in which a substantially constant temperature may be maintained in the heater unit 302. To this end, the heater unit 302 may be operated on the basis of a constant parameter setting, for instance a constant energy supplied thereto, while the controller 305 may provide the signal 304B such that the lamp controller 303C may re-adjust the power supplied to the radiation source 303 such that a difference between the current temperature of the unit 302 and a target temperature is reduced so as to stay within a small range. For example, a regulator, for instance in the form of an analog device or a digital device, may receive the temperature signal 302T and a reference signal 302R and may generate the signal 304B on the basis of a difference of the signals 302T and 302R. For example, these signals may be supplied to a proportional part 305P of the controller 305, which may thus reduce the signal 304B when the signal 302T is greater than the reference signal 302R. Similarly, the signal 304B may be increased when the signal 302T is less than the reference signal 302R. Consequently, the lamp controller 303C may be instructed to provide an increased amount of power to the radiation source 303 when the current temperature indicated by the signal 302T is below the target temperature indicated by the signal 302R. Conversely, a reduced power may be supplied to the source 303 when the temperature is above the target temperature. Since the heater unit 302 may be operated with a constant parameter setting, the deviation from the target temperature may stem from the variation of the irradiance, which may thus be compensated for by re-adjusting the power supplied to the radiation source 303. It should be appreciated that the controller 305 may comprise additional regulator paths, such as an integral portion 305I and/or a differential portion 305D, in order to enhance the controller stability. For this purpose, any appropriate P, PI or PID control algorithms or hardware components may used.

Consequently, the irradiance of the tool 300 may be monitored and/or controlled on the basis of any appropriate time interval as is compatible with the thermal response times of, for instance, the heater unit 302 without requiring dedicated substrates or being dependent on UV sensors having a non-acceptable long-term behavior. Since the monitor signal 302T or 302P (FIG. 3b) may be obtained prior to, during and after the processing of the substrates, a substantially continuous monitoring may be achieved. Moreover, in some illustrative embodiments, an efficient control mechanism may be established, wherein, due to the fast response provided by the monitor signals 302T or 302P, even a run-to-run control strategy may be applied.

With reference to FIGS. 4a-4d, a UV treatment may be performed on the basis of the process tools and process strategies described above with reference to FIGS. 3a-3d, thereby providing dielectric materials with superior uniformity.

Figure 4A:
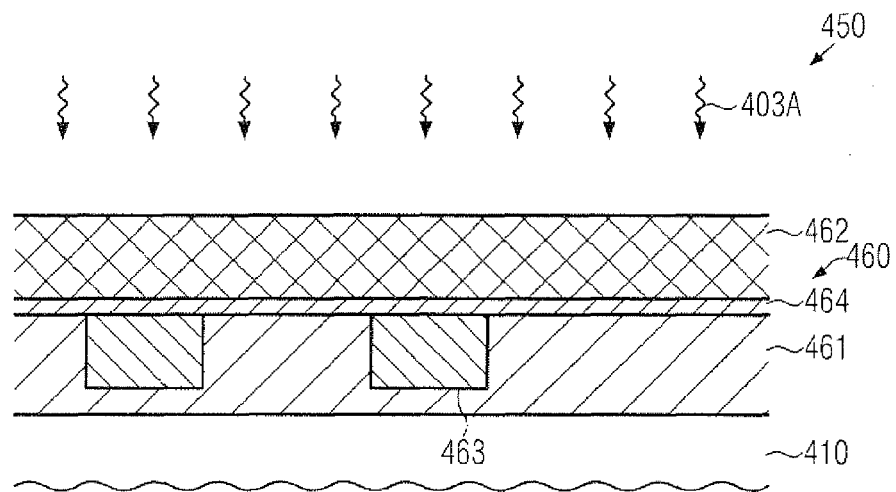
FIGS. 4a-4d schematically illustrate cross-sectional views of semiconductor devices during various manufacturing stages in treating a dielectric material on the basis of UV radiation having a superior stability, according to still further illustrative embodiments.

FIG. 4a schematically illustrates a semiconductor device 450 comprising a substrate 410, which may represent any appropriate carrier material for forming any structural features as required. For example, the substrate 410 may represent a material including a semiconductor material in which transistor elements, resistors and the like may be formed.

Furthermore, in the embodiment shown, the device 450 may comprise a metallization system 460 comprising a dielectric material 461, in which may be formed a plurality of metal regions 463, for instance in the form of metal lines and the like. The dielectric material 461 may be provided in the form of a low-k dielectric material, at least partially, as previously indicated. Similarly, the metal regions 463 may comprise any highly conductive material, such as copper, silver, copper alloys and the like. Moreover, an etch stop or cap layer 464 may be formed on the dielectric material 461 and the metal regions 463. Furthermore, the metallization system 460 may comprise a further dielectric layer 462, which may be provided in the form of a low-k dielectric material having any appropriate material composition. For example, frequently, silicon- and oxygen-containing materials may be used in combination with sophisticated metallization systems, wherein an additional treatment on the basis of UV radiation 403A may enable a further reduction of the dielectric constant in order to achieve a value of 3.0 and significantly less, as is also previously discussed.

The semiconductor device 450 may be formed on the basis of well-established process techniques in order to form the metallization system 460 as shown in FIG. 4a. It should be appreciated that sophisticated deposition techniques, lithography techniques, etch techniques and the like may typically be required for forming complex semiconductor devices in which critical dimensions, such as lateral extensions of the metal regions 463, may be several hundred nanometers and significantly less. For example, the dielectric material 462 may be deposited on the basis of well-established chemical vapor deposition (CVD) techniques using well-known precursor materials, while, in other cases, spin-on techniques may be applied, depending on the characteristics of the material 462. Thereafter, the substrate 410 may be positioned in a UV process tool, such as the tool 300 as previously described, and the layer 462 may be exposed to the radiation 403A, wherein, due to the superior monitoring efficiency of the corresponding UV tool, the UV treatment may be accomplished with superior uniformity, which may thus result in superior material characteristics. For instance, the device 450 may be treated with radiation 403A only if a valid irradiance status has been identified for the corresponding process tool. In other cases, an efficient control of the radiation 403A may be applied, as previously discussed.

Figure 4B:
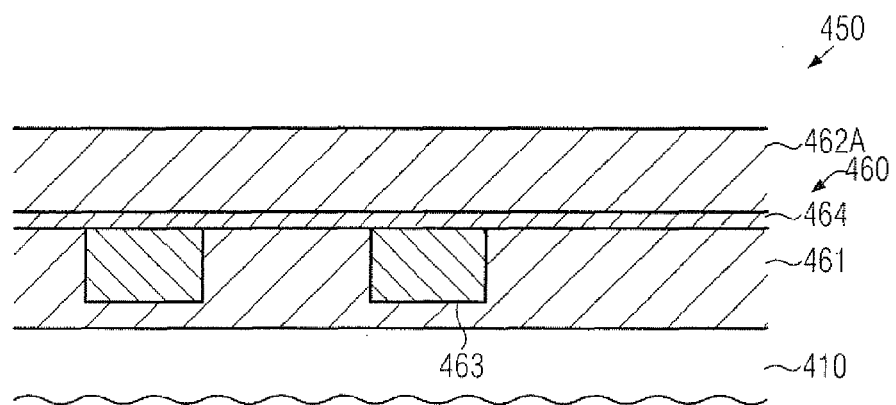

FIG. 4b schematically illustrates the device 450 after being exposed to the radiation 403A (FIG. 4a). In this case, a "new" material 462A may be provided, for instance, by changing one or more of the material characteristics of the initially deposited material 462 (FIG. 4a). For instance, the dielectric constant may be reduced and adjusted to a desired value on the basis of the radiation 403A (FIG. 4a) having the superior uniformity.

Figure 4C:
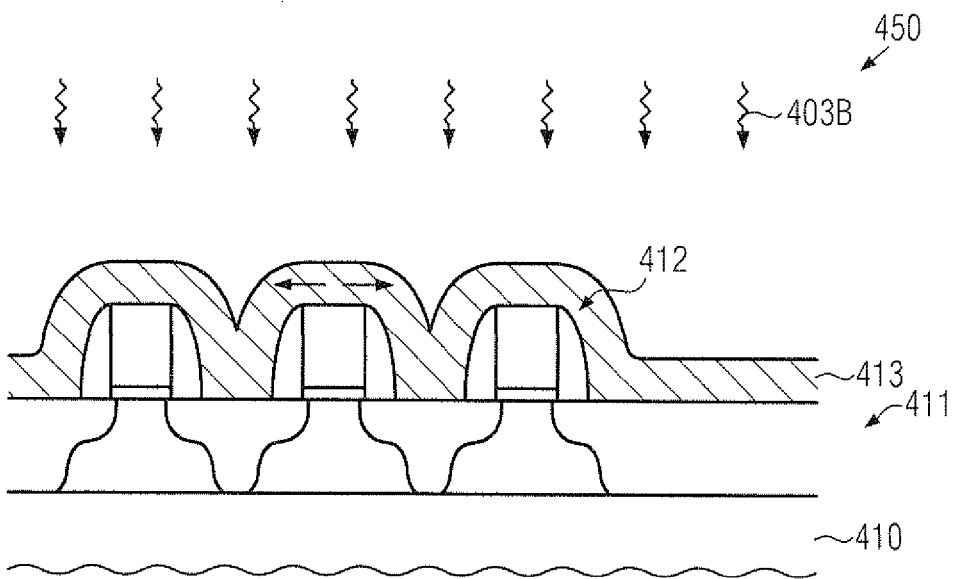

FIG. 4c schematically illustrates the semiconductor device 450 according to further illustrative embodiments in which a plurality of circuit elements 412, such as field effect transistors, are formed in and above a semiconductor layer 411, which may be provided above the substrate 410. Furthermore, a dielectric material 413 may be formed above the transistors 412 and may have any desired internal stress level. For example, the material 413 may be provided in the form of a silicon nitride-based material which is to be used to adjust a resulting strain component in the layer 411 in order to enhance performance of the transistors 412, as is also previously explained. It is well known that, for instance, silicon nitride material may be deposited on the basis of plasma enhanced CVD techniques so as to have a high compressive stress or a high tensile stress or a substantially neutral stress level, depending on the deposition conditions. For example, the material 413 may be provided with a high internal compressive stress level which, however, may be considered inappropriate for the transistors 412, while, in other device areas, the high compressive stress may be advantageous for enhancing performance of other circuit elements. In this case, the material 413 may be selectively exposed to UV radiation 403B in order to obtain a desired degree of stress modification, which may strongly depend on the irradiance, as previously explained. Consequently, the device 450 may be subjected to a UV treatment, for instance using a process tool as described above with reference to the tools 300, and applying any appropriate monitoring and/or control strategy in order to achieve superior uniformity of the radiation 403B, when treating a plurality of substrates 410.

It should be appreciated that the semiconductor device 450 as illustrated in FIG. 4c may be formed on the basis of any appropriate manufacturing techniques in order to obtain the circuit elements 412 having the desired critical dimensions.

Figure 4D:
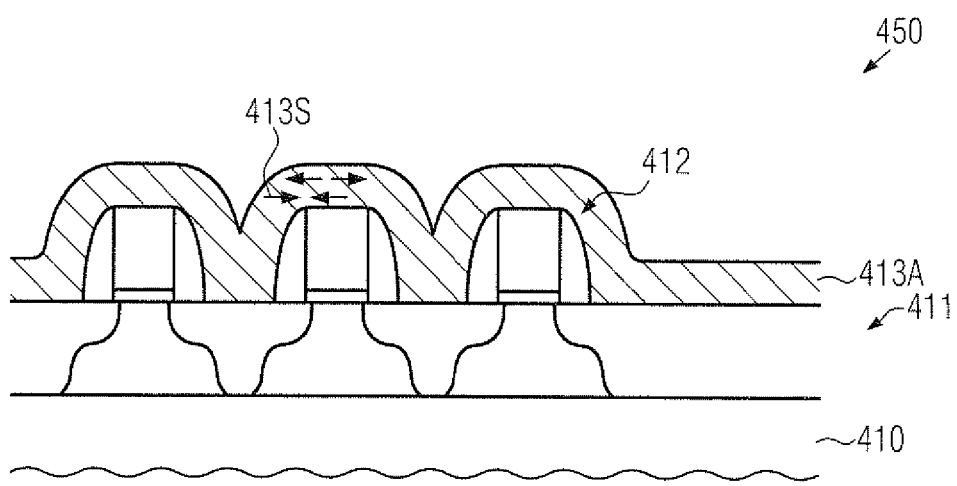

FIG. 4d schematically illustrates the device 450 with the modified material 413A, wherein an internal stress level 413S may be significantly less compared to an initial compressive stress level, while, in other cases, even a tensile stress component may be achieved. It should be appreciated that, depending on the initial stress level of the layer 413 of FIG. 4c, the exposure to UV radiation may result in a shift into the "tensile direction" so that an initial tensile stress may be significantly increased, while an initial compressive stress level may be "converted" into a tensile stress level, as shown in FIGS. 4c and 4d. Due to the superior uniformity of the radiation 403B (FIG. 4c), also in this case, superior device characteristics may be achieved since the internal stress level of the material 413A may be adjusted with an increased degree of precision.

As a result, the present disclosure provides UV process tools and manufacturing techniques in which irradiance of a radiation source may be monitored and/or controlled on the basis of a monitor signal that reflects the thermal conditions within the process chamber. Since the UV radiation may represent a part of the thermal conditions, the momentary irradiance may be efficiently monitored by monitoring the temperature within the process chamber or by monitoring any other characteristic that is correlated to the chamber internal temperature, wherein, in some illustrative embodiments, a heater unit may be efficiently used as an "irradiance" sensor. Consequently, a cost-efficient, fast and reliable detection of the momentary irradiance may be accomplished without requiring dedicated substrates or additional metrology strategies, which may conventionally result in a degraded tool throughput. Furthermore, the monitor signal based on the heater temperature may be efficiently used in controlling the irradiance, thereby even further enhancing the overall uniformity of UV treatments during the semiconductor processing.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of monitoring a UV irradiance during semiconductor processing in a UV process tool, the method comprising:
   operating a UV radiation source of said UV process tool with a predefined parameter setting;
   obtaining a monitor signal from a hardware component of said UV process tool, said monitor signal indicating a process temperature in a process chamber of said UV process tool; and
   determining a UV irradiance status of said radiation source by using said predefined parameter setting a correlation between the UV irradiance and said monitor signal.

2. The method of claim 1, wherein said monitor signal represents a temperature signal of a process chamber internal component of said UV tool.

3. The method of claim 2, wherein said monitor signal represents a temperature of a heater unit provided in said process chamber.

4. The method of claim 1, wherein said monitor signal represents an input power of a heater unit of said process chamber operated so as to maintain a substantially constant temperature of said heater unit.

5. The method of claim 1, wherein determining said UV irradiance status comprises obtaining a correlation between said process temperature and an irradiance of said UV radiation source.

6. A method of monitoring a UV irradiance during semiconductor processing in a UV process tool, the method comprising:
   operating a UV radiation source of said UV process tool with a predefined parameter setting;
   obtaining a monitor signal from a hardware component of said UV process tool, said monitor signal indicating a process temperature in a process chamber of said UV process tool; and
   determining a UV irradiance status of said radiation source by using said predefined parameter setting and said monitor signal, wherein determining said UV irradiance status comprises obtaining a correlation between said process temperature and an irradiance of said UV radiation source, and wherein determining said UV irradiance status comprises obtaining a correlation between said monitor signal and an irradiance of said UV radiation source.

7. The method of claim 1, further comprising indicating said UV irradiance status after processing a predefined number of substrates in said process chamber.

8. The method of claim 7, wherein said UV irradiance status is indicated for individual substrates processed in said process chamber.

9. The method of claim 1, further comprising controlling an input power of said radiation source on the basis of said monitor signal.

10. The method of claim 9, wherein said radiation source is controlled so as to keep said process temperature substantially constant.

* * * * *